(12) United States Patent
Kim et al.

(10) Patent No.: US 10,388,224 B2
(45) Date of Patent: Aug. 20, 2019

(54) QUANTUM DOT LIGHT EMITTING DEVICE AND OPTICAL APPARATUS INCLUDING THE SAME

(71) Applicant: SAMSUNG ELECTRONICS CO., LTD., Suwon-si (KR)

(72) Inventors: Hyochul Kim, Yongin-si (KR); Yeonsang Park, Seoul (KR); Kyungsang Cho, Gwacheon-si (KR); Weonkyu Koh, Suwon-si (KR); Younggeun Roh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/450,128

(22) Filed: Mar. 6, 2017

(65) Prior Publication Data

US 2018/0102093 A1 Apr. 12, 2018

(30) Foreign Application Priority Data

Oct. 11, 2016 (KR) .......................... 10-2016-0131622

(51) Int. Cl.
 *H01L 33/06* (2010.01)
 *H01S 5/02* (2006.01)
 (Continued)

(52) U.S. Cl.
 CPC .............. *G09G 3/3258* (2013.01); *G01J 1/08* (2013.01); *G02B 27/425* (2013.01);
 (Continued)

(58) Field of Classification Search
 CPC ..... G01J 1/08; G02B 27/4244; G02B 27/425; G02B 27/4294; G09G 3/3258;
 (Continued)

(56) References Cited

U.S. PATENT DOCUMENTS

| 5,559,822 A | * | 9/1996 | Pankove | ................ | B82Y 20/00 257/14 |
| 5,703,896 A | * | 12/1997 | Pankove | ................ | B82Y 20/00 372/23 |

(Continued)

FOREIGN PATENT DOCUMENTS

| CN | 103837918 A | 6/2014 |
| CN | 105609534 A | 5/2016 |

(Continued)

OTHER PUBLICATIONS

Communication issued by the European Patent Office dated Mar. 8, 2018 in counterpart European Patent Application No. 17195830.9.
(Continued)

*Primary Examiner* — Michael J Eurice
(74) *Attorney, Agent, or Firm* — Sughrue Mion, PLLC

(57) ABSTRACT

A quantum dot light emitting device includes a grating device which includes a grating region that has a particular grating interval, and a quantum dot layer located above the grating region. The device provides high-purity color light based on a selection of a wavelength band by the grating region in correspondence with a wavelength band of light emitted from the quantum dot layer.

21 Claims, 15 Drawing Sheets

(51) Int. Cl.

| | |
|---|---|
| *H01S 5/125* | (2006.01) |
| *G09G 3/3258* | (2016.01) |
| *G01J 1/08* | (2006.01) |
| *G02B 27/42* | (2006.01) |
| *H01L 33/44* | (2010.01) |
| *H01L 51/50* | (2006.01) |
| *H01L 51/52* | (2006.01) |
| *H01L 27/32* | (2006.01) |

(52) U.S. Cl.
CPC .......... *G02B 27/4244* (2013.01); *H01L 33/06* (2013.01); *H01L 33/44* (2013.01); *H01L 51/502* (2013.01); *H01L 51/5275* (2013.01); *G02B 27/4294* (2013.01); *G09G 2300/0426* (2013.01); *G09G 2320/0626* (2013.01); *H01L 27/3211* (2013.01); *H01L 51/504* (2013.01); *H01L 51/508* (2013.01); *H01L 51/5036* (2013.01); *H01L 51/5048* (2013.01); *H01L 51/5052* (2013.01); *H01L 51/5056* (2013.01); *H01L 51/5064* (2013.01); *H01L 51/5072* (2013.01); *H01L 51/5265* (2013.01)

(58) Field of Classification Search
CPC .... G09G 2300/0426; G09G 2320/0626; H01L 33/44; H01L 33/06; H01L 51/5016; H01L 51/502; H01L 51/5036; H01L 51/504; H01L 51/5048; H01L 51/5052; H01L 51/5056; H01L 51/5064; H01L 51/5072; H01L 51/508; H01L 51/5265; H01L 51/5275; H01S 3/094096; H01S 5/141; H01S 5/187; H01S 5/4087
See application file for complete search history.

(56) References Cited

U.S. PATENT DOCUMENTS

| | | | |
|---|---|---|---|
| 8,330,142 B2 | 12/2012 | Cho et al. | |
| 8,644,359 B1* | 2/2014 | Chen ..................... | H01S 5/4031 372/50.1 |
| 9,006,749 B2 | 4/2015 | Kim et al. | |
| 9,496,308 B2* | 11/2016 | Haddad ............... | H01L 27/1462 |
| 9,720,149 B2* | 8/2017 | Wu ........................ | G02B 5/201 |
| 9,871,160 B2* | 1/2018 | Tian .................. | H01L 27/14603 |
| 2006/0125388 A1 | 6/2006 | Song et al. | |
| 2009/0086785 A1* | 4/2009 | Hatori .................... | B82Y 20/00 372/50.11 |
| 2009/0152664 A1* | 6/2009 | Klem ................. | H01L 27/14603 257/440 |
| 2010/0213438 A1* | 8/2010 | Cho ........................ | B82Y 20/00 257/13 |
| 2010/0219427 A1* | 9/2010 | Fukuda ............... | H01L 51/5265 257/89 |
| 2011/0006282 A1* | 1/2011 | Hatori ..................... | B82Y 20/00 257/13 |
| 2011/0220971 A1* | 9/2011 | Haddad ............. | H01L 27/14623 257/228 |
| 2011/0227036 A1* | 9/2011 | Vaufrey ............... | H01L 51/5016 257/13 |
| 2011/0309236 A1* | 12/2011 | Tian .................. | H01L 27/14603 250/208.1 |
| 2012/0313205 A1* | 12/2012 | Haddad ............. | H01L 31/02363 257/432 |
| 2014/0374696 A1* | 12/2014 | Liu ....................... | H01L 51/502 257/13 |
| 2015/0102291 A1* | 4/2015 | Park .................... | H01L 27/3216 257/40 |
| 2015/0194579 A1 | 7/2015 | Chung et al. | |
| 2015/0364523 A1* | 12/2015 | Sato ...................... | H01L 51/502 257/13 |
| 2016/0099262 A1* | 4/2016 | Lin ..................... | H01L 27/3255 257/43 |
| 2016/0254324 A1* | 9/2016 | Liu ..................... | H01L 51/5246 257/40 |
| 2016/0293875 A1* | 10/2016 | Zhang .................. | H01L 51/502 |
| 2016/0370655 A1* | 12/2016 | Nagayama .......... | H01L 51/5281 |
| 2017/0098922 A1* | 4/2017 | Hatori ..................... | H04B 10/40 |
| 2017/0125506 A1* | 5/2017 | Kim .................. | H01L 27/3276 |
| 2017/0179438 A1* | 6/2017 | Xu .......................... | H01L 21/77 |
| 2017/0233645 A1* | 8/2017 | Zhong ................... | C09K 11/02 252/301.16 |
| 2017/0254933 A1* | 9/2017 | Li ............................ | G02B 5/20 |
| 2017/0256686 A1* | 9/2017 | Li ............................ | F21V 9/40 |
| 2017/0358621 A1* | 12/2017 | Jiang ..................... | H04N 9/045 |
| 2018/0175241 A1* | 6/2018 | Jain ....................... | H01L 33/06 |
| 2018/0175316 A1* | 6/2018 | Chen .................... | H01L 51/502 |
| 2018/0190625 A1* | 7/2018 | Steckel ............. | G02F 1/133603 |
| 2018/0190942 A1* | 7/2018 | Song .................. | H01L 51/5275 |

FOREIGN PATENT DOCUMENTS

| | | |
|---|---|---|
| JP | 11112099 A | 4/1999 |
| JP | 4813675 B2 | 11/2011 |

OTHER PUBLICATIONS

Xuyong Yang et al., "Light Extraction Efficiency Enhancement of Colloidal Quantum Dot Light-Emitting Diodes Using Large-Scale Nanopillar Arrays", Advanced Functional Materials, Oct. 5, 2014, pp. 5977-5984, vol. 24, No. 38, Wiley-VCH Verlag GmbH & Co. KGaA, XP001592807, DOI: 10.1002/ADFM.201400190.

Heo et al: "Coherent and directional emission at 1.55 μm from PbSe colloidal quantum dot electroluminescent device on silicon", Optics Express, Dec. 19, 2011, vol. 19, No. 27, pp. 26394-26398, (5 pages total).

Song et al: "Optically-Pumped Lasing in Hybrid Organic-Inorganic Light-Emitting Diodes", Adv. Funct. Mater. 2009, 19, pp. 2130-2136 (7 pages total).

Kim et al: "Full-colour quantum dot displays fabricated by transfer printing", Nature Photonics, vol. 5, Mar. 2011, pp. 176-182, (7 pages total).

Roh, et al., "Surface-emitting red, green, and blue colloidal quantum dot distributed feedback lasers", Optics Express, vol. 22, Issue No. 15, Jul. 25, 2014, pp. 18800-18806.

* cited by examiner

QUANTUM DOT LIGHT EMITTING DEVICE AND OPTICAL APPARATUS INCLUDING THE SAME

CROSS-REFERENCE TO RELATED APPLICATION

This application claims priority from Korean Patent Application No. 10-2016-0131622, filed on Oct. 11, 2016, in the Korean Intellectual Property Office, the disclosure of which is incorporated herein by reference in its entirety.

BACKGROUND

1. Field

Exemplary embodiments relate to quantum dot light emitting devices and optical apparatuses including the same.

2. Description of the Related Art

Quantum dots emit light via electroluminescence or photoluminescence. Since light emitted from quantum dots has a narrow emission spectrum and a wavelength thereof is easily controllable, the quantum dots are regarded as one of materials that is usable for next-generation light emitting devices.

SUMMARY

Provided are quantum dot light emitting devices that provide high-purity color light and optical apparatuses including the same.

Additional aspects will be set forth in part in the description which follows and, in part, will be apparent from the description, or may be learned by practice of the presented exemplary embodiments.

According to an aspect of an exemplary embodiment, a quantum dot light emitting device includes a grating device including a first grating region that has a first grating interval, and a second grating region that has a second grating interval which is different from the first grating interval, and an emission layer located above the grating device and including a first quantum dot layer configured to emit light of a wavelength band which is selected by the first grating region.

The quantum dot light emitting device may further include a first electrode and a second electrode which are arranged such that the first quantum dot layer is located between the first electrode and the second electrode.

The first electrode, the first quantum dot layer, and the second electrode may be successively stacked in a direction that is perpendicular to a direction of the first grating interval.

The quantum dot light emitting device may further include a hole transport layer located between the first quantum dot layer and the first electrode, and an electron transport layer located between the first quantum dot layer and the second electrode.

The first grating region may include a plurality of strip-shaped protruding patterns.

The first grating region may include a plurality of pillar-shaped protruding patterns or groove patterns.

Spaces between the protruding patterns included in the first grating region may be filled with a material that has a refractive index which is different from a refractive index of the grating device.

The quantum dot light emitting device may further include a pump light source configured to provide exciting light to the emission layer.

The grating device may further include at least a third grating region that has a grating interval which is different from each of the first grating interval and the second grating interval.

The emission layer may further include a second quantum dot layer which is arranged to face the second grating region and is configured to emit light of a wavelength band selected by the second grating region, and a third quantum dot layer which is arranged to face the third grating region and is configured to emit light of a wavelength band selected by the third grating region.

The first quantum dot layer may be arranged to face all of the first grating region, the second grating region, and the third grating region.

The first quantum dot layer may be configured to emit light of a plurality of wavelength bands including a first wavelength band selected by the first grating region, a second wavelength band selected by the second grating region, and a third wavelength band selected by the third grating region.

The first quantum dot layer may include a plurality of quantum dots that has at least three different quantum dot sizes.

The grating device may be made of an insulating material.
The grating device may be made of a conductive material.
The quantum dot light emitting device may further include an electrode which is disposed above the first quantum dot layer, and when a voltage is applied between the electrode and the grating device, the applied voltage may cause an emission of light from the emission layer.

According to an aspect of another exemplary embodiment, a display apparatus includes a grating device including a first grating region that has a first grating interval, a second grating region that has a second grating interval which is different from the first grating interval, and a third grating region that has a third grating interval which is different from each of the first grating interval and the second grating interval, an emission layer located above the grating device and including a first quantum dot layer that is arranged to face the first grating region, a second quantum dot layer that is arranged to face the second grating region, and a third quantum dot layer that is arranged to face the third grating region, a first electrode that is arranged to face the emission layer, and a plurality of second electrodes, each respective second electrode being arranged to face a corresponding one from among the first quantum dot layer, the second quantum dot layer, and the third quantum dot layer.

The display apparatus may further include a driving circuit layer including a plurality of transistors, each respective transistor being configured to provide a respective electrical signal to a corresponding one from among the plurality of second electrodes in order to control an emission of light from the first quantum dot layer, the second quantum dot layer, and the third quantum dot layer.

According to an aspect of another exemplary embodiment, an optical sensor includes a quantum dot light emitting device configured to irradiate light toward an object, and including a grating device including a first grating region that has a first grating interval, and a second grating region that has a grating interval which is different from the first grating interval, and an emission layer located above the grating device and including a first quantum dot layer configured to emit light of a wavelength band which is selected by the first grating region, and a sensor component configured to receive light reflected from the object.

The emission layer may further include a second quantum dot layer that is arranged to face the second grating region and is configured to emit light of a wavelength band selected by the second grating region.

The first quantum dot layer may be arranged to face both of the first grating region and the second grating region.

The first quantum dot layer may be configured to emit light of a plurality of wavelength bands including a first wavelength band selected by the first grating region, and a second wavelength band selected by the second grating region.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
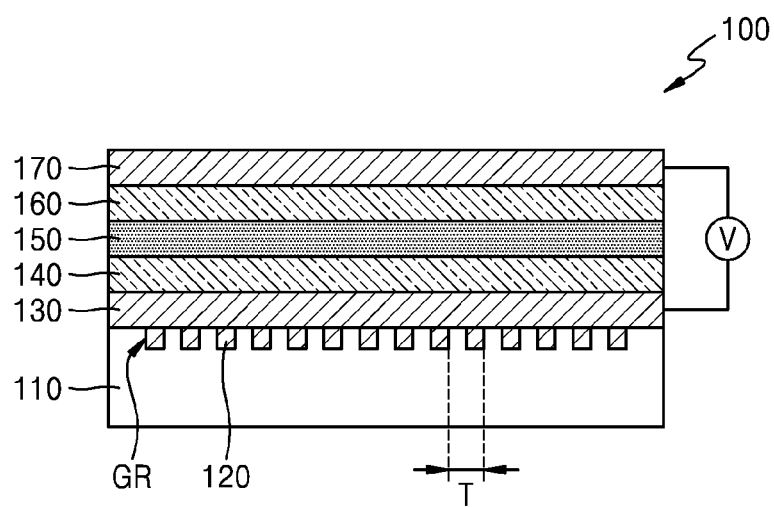
FIG. 1 is a cross-sectional view of a quantum dot light emitting device, according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when a layer is referred to as being "on" another layer or substrate, it can be directly in contact with the other layer or substrate, or intervening layers may also be present.

As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

In the following description, a suffix "unit" or "module" is used to describe an element for performing at least one function or operation, and may be implemented as hardware, software, or a combination thereof.

FIG. 1 is a cross-sectional view of a quantum dot light emitting device 100, according to an exemplary embodiment.

The quantum dot light emitting device 100 includes a grating device 110 including a grating region GR that has a certain grating interval T, and an emission layer provided above the grating device 110. The emission layer includes a quantum dot layer 150, and the quantum dot layer 150 includes a plurality of quantum dots configured to emit light of a wavelength band selected by the grating region GR.

The quantum dots of the quantum dot layer 150 may include at least one from among, for example, a Group II-VI semiconductor, a Group III-V semiconductor, a Group IV-VI semiconductor, a Group IV semiconductor, and graphene quantum dots. The Group II-VI semiconductor may include at least one from among, for example, binary compounds such as CdS, CdSe, CdTe, ZnS, ZnSe, ZnTe, ZnO, HgS, HgSe, and HgTe, ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe, quaternary compounds such as CdHgZnTe, CdZnSeS, CdZnSeTe, CdZnSTe, CdHgSeS, CdHgSeTe, CdHgSTe, HgZnSeS, HgZnSeTe, and HgZnSTe, and combinations thereof. The Group III-V semiconductor may include at least one from among, for example, binary compounds such as GaN, GaP, GaAs, GaSb, AlN, AlP, AlAs, AlSb, InN, InP, InAs, and InSb, ternary compounds such as GaNP, GaNAs, GaNSb, GaPAs, GaPSb, AlNP, AlNAs, AlNSb, AlPAs, AlPSb, InNP, InNAs, InNSb, InPAs, and InPSb, quaternary compounds such as GaAlNP, GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, and InAlPSb, and combinations thereof. The Group IV-VI semiconductor may include at least one from among, for example, binary compounds such as SnS, SnSe, SnTe, PbS, PbSe, and PbTe, ternary compounds such as SnSeS, SnSeTe, SnSTe, PbSeS, PbSeTe, PbSTe, SnPbS, SnPbSe, and SnPbTe, quaternary compounds such as SnPbSSe, SnPbSeTe, and SnPbSTe, and combinations thereof. The Group IV semiconductor may include at least one from among, for example, Si, Ge, SiGe, SiC, and combinations thereof. The graphene quantum dots may be quantum dots made of graphene.

The quantum dots of the quantum dot layer 150 may have a monolayer or multilayer structure. The quantum dots may have a core-shell structure that includes a core and a shell surrounding the core or a particle structure having no shell. The quantum dots may have a diameter that has a length which is equal to or less than several ten nanometers and, more particularly, a diameter that has a length which is equal to or less than about 10 nm.

The quantum dots of the quantum dot layer 150 may generate electron-hole pairs by injecting electrons and holes caused by an applied voltage or by absorbing light, and emit light due to transition of energy states thereof. The quantum dots have unique absorption, excitation, and emission wavelengths that vary based on the material and size thereof. Accordingly, a wavelength band of emitted light may be changed by controlling the material and/or size of the quantum dots of the quantum dot layer 150. Since even quantum dots made of the same material emit light of different wavelength bands that vary based on the sizes thereof, the wavelength band of the emitted light may be easily changed by controlling the size of the quantum dots.

The quantum dot light emitting device 100 may further include a first electrode 170 and a second electrode 130 that are arranged so as to dispose the quantum dot layer 150 therebetween.

Each of the first and second electrodes 170 and 130 may be made of a transparent conductive material. For example, any of indium tin oxide (ITO), indium zinc oxide (IZO), zinc oxide (ZnO), indium oxide (In$_2$O$_3$), indium gallium oxide (IGO), or aluminum zinc oxide (AZO) may be used.

The material of the first and second electrodes 170 and 130 is not limited to the transparent conductive material. For example, the first electrode 170 may be made of a metal material such as silver (Ag), magnesium (Mg), aluminum (Al), platinum (Pt), palladium (Pd), gold (Au), nickel (Ni), neodymium (Nd), iridium (Ir), chromium (Cr), or a compound thereof. In this case, light is not emitted via the first electrode 170 and thus an emission direction may be controlled.

The quantum dot light emitting device 100 may further include an electron transport layer 160 located between the quantum dot layer 150 and the first electrode 170, and a hole transport layer 140 located between the quantum dot layer 150 and the second electrode 130. The locations of the electron transport layer 160 and the hole transport layer 140 may be reversed.

The electron transport layer 160 may be made of an inorganic semiconductor. The inorganic semiconductor may be an n-type semiconductor. The inorganic semiconductor may be an oxide or a non-oxide. Alternatively, the electron transport layer 160 may be made of an n-type organic semiconductor.

The hole transport layer 140 may include an organic semiconductor. The organic semiconductor may be a p-type semiconductor. The organic semiconductor may include a low-molecular or polymer-based organic material. Alternatively, the hole transport layer 140 may be made of a p-type inorganic semiconductor.

The quantum dot light emitting device 100 of the exemplary embodiment employs the grating device 110 to generate high-purity color light, and the grating device 110 includes the grating region GR that has the certain grating interval T.

The grating region GR may be designed to have light wavelength selectivity. The grating region GR may be designed to select a part of a wavelength band of light emitted from the quantum dot layer 150. The grating region GR may have the grating interval T along a horizontal direction, i.e., a direction perpendicular to a direction in which the second electrode 130, the quantum dot layer 150, and the first electrode 170 are successively stacked on one another. The grating region GR may serve as a resonant cavity. Depending on the designed shape, the interval T, or the like, the grating region GR may selectively emit light of a specific wavelength band. In addition, the grating region GR may control the width of the wavelength band of the emitted light. The grating region GR may reduce the width of the wavelength band to a range of about several nanometers.

The wavelength band selected by the grating region GR may include the wavelength band of the light emitted from the quantum dot layer 150. Alternatively, the grating region GR may be designed in such a manner that a center wavelength of the grating region GR corresponds to or is almost equal to a center wavelength of the light emitted from the quantum dot layer 150. The difference between the center wavelength of the grating region GR and the center wavelength of the light emitted from the quantum dot layer 150 may be within several ten nanometers.

The grating device 110 may be made of a variety of materials. An insulating material such as a dielectric material, glass, or polymer may be used, but the grating device 110 is not limited thereto.

A filling material 120 made of a material that has a refractive index which is different from that of the grating device 110 may be provided in spaces between protruding patterns of the grating region GR. The filling material 120 may be, for example, the material of the second electrode 130 provided adjacent to the grating device 110, i.e., a transparent conductive material, or air. The difference in refractive index between the grating region GR and a peripheral material thereof may serve as a design factor for selecting a wavelength band, together with the interval T of the grating region GR.

Figure 2:
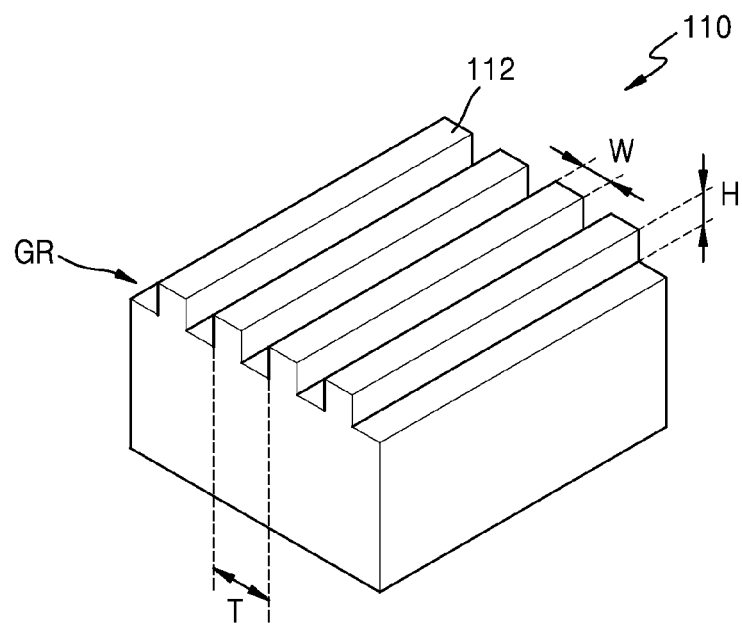
FIG. 2 is a perspective view of an example of a grating device that is employable in the quantum dot light emitting device, according to an exemplary embodiment.
Figure 3:
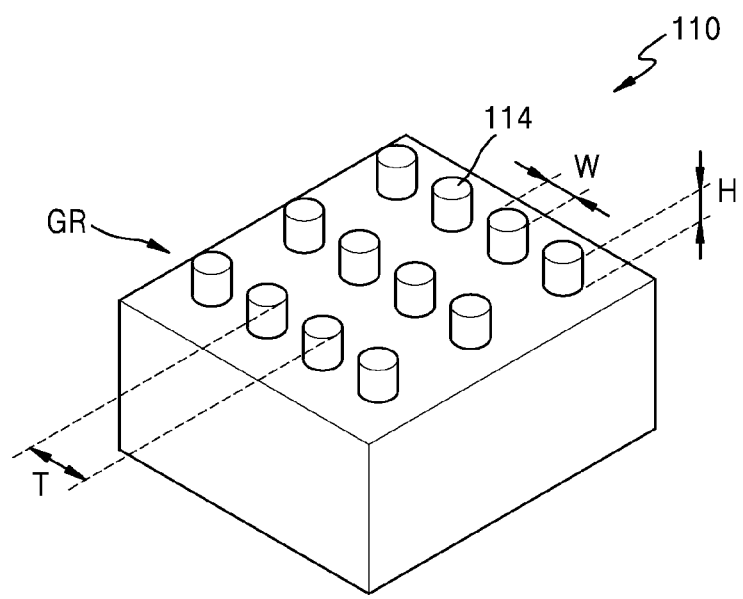
FIG. 3 is a perspective view of another example of the grating device that is employable in the quantum dot light emitting device, according to an exemplary embodiment.

FIG. 2 is a perspective view of an example of the grating device 110 which is employable in the quantum dot light emitting device 100, according to an exemplary embodiment, and FIG. 3 is a perspective view of another example of the grating device 110 which is employable in the quantum dot light emitting device 100, according to an exemplary embodiment.

Referring to FIG. 2, the grating region GR may include a plurality of strip-shaped protruding patterns 112. The plurality of strip-shaped protruding patterns 112 may be arranged in a one-dimensionally repeating arrangement, e.g., from one side of the grating device 110 to the opposite side thereof.

Referring to FIG. 3, the grating region GR may include a plurality of pillar-shaped protruding patterns 114. The plurality of pillar-shaped protruding patterns 114 may be arranged in a two-dimensionally repeating arrangement, e.g., throughout an entirety of a top surface of the grating device 110. Although cylindrical pillars are illustrated in FIG. 3, the pillar shape is not limited thereto, and a variety of types of pillars such as oval pillars and polygonal pillars may be employed. In addition, the pillar-shaped protruding patterns 114 illustrated in FIG. 3 may be modified into pillar-shaped groove patterns.

A wavelength band may be selected by adjusting any one or more of an interval T, a height H, and a width W of the strip-shaped or pillar-shaped protruding patterns 112 or 114. The interval T, the height H, and the width W may have values between about 50 nm and about 1000 nm in such a manner that the wavelength band is selected in a visible light wavelength range.

Figure 4:
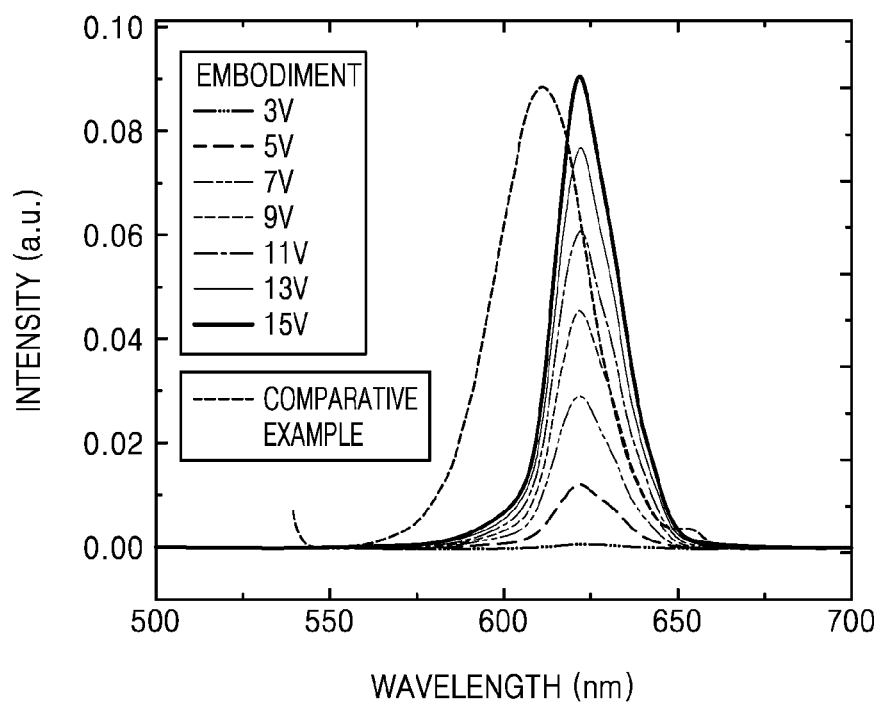
FIG. 4 is a graph showing an emission spectrum of the quantum dot light emitting device according to an exemplary embodiment based on an applied voltage, and an emission spectrum of a light emitting device according to a comparative example.

FIG. 4 is a graph showing an emission spectrum of the quantum dot light emitting device 100 according to an exemplary embodiment based on an applied voltage, and an emission spectrum of a light emitting device according to a comparative example.

Referring to the graph, the quantum dot light emitting device 100 according to an exemplary embodiment emits light of a wavelength band set by the quantum dot layer 150, and the intensity of the light is increased in proportion to the applied voltage.

In the graph, the comparative example shows an emission spectrum obtained by using only the quantum dot layer 150 without using any grating device. The emission spectrum of the comparative example is obtained by pumping light without applying a voltage, and illustrated to compare the width thereof to that of the exemplary embodiment that includes the grating device 110.

As shown in the graph, the spectrum of the comparative example has a center wavelength similar to that of the spectrum of the exemplary embodiment, but has a width greater than that of the spectrum of the exemplary embodiment. In the quantum dot light emitting device 100 according to an exemplary embodiment, since the grating device 110 selects a part of a wavelength band of light emitted from the quantum dot layer 150, a narrower spectrum is obtained.

Figure 5:
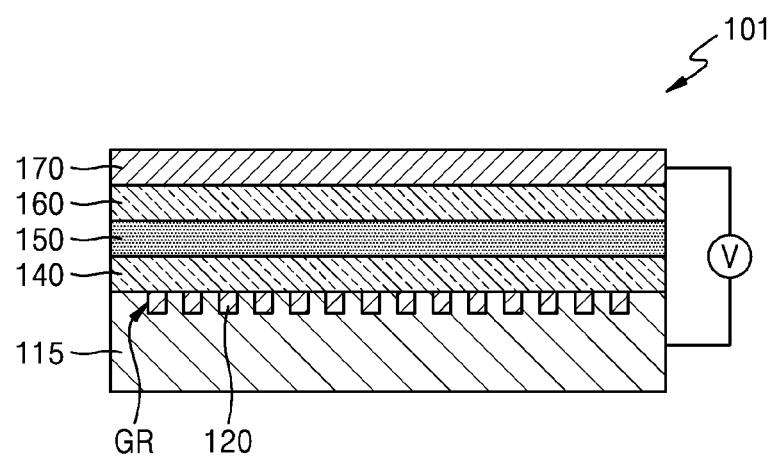
FIG. 5 is a cross-sectional view of a quantum dot light emitting device, according to another exemplary embodiment.

FIG. 5 is a cross-sectional view of a quantum dot light emitting device 101, according to another exemplary embodiment.

The quantum dot light emitting device 101 of the current exemplary embodiment differs from the quantum dot light emitting device 100 of FIG. 1 in the material of a grating device 115.

The grating device 115 may be made of a conductive material. A transparent conductive material such as ITO, IZO, ZnO, $In_2O_3$, IGO, or AZO, or a metal material such as Ag, Mg, Al, Pt, Pd, Au, Ni, Nd, Ir, Cr, or a compound thereof may be used as the conductive material. Since the grating device 115 is made of the conductive material, the second electrode 130 included in the quantum dot light emitting device 100 of FIG. 1 may be omitted, and a voltage for emission of light from a quantum dot layer 150 may be applied between the grating device 115 and a first electrode 170.

Figure 6:
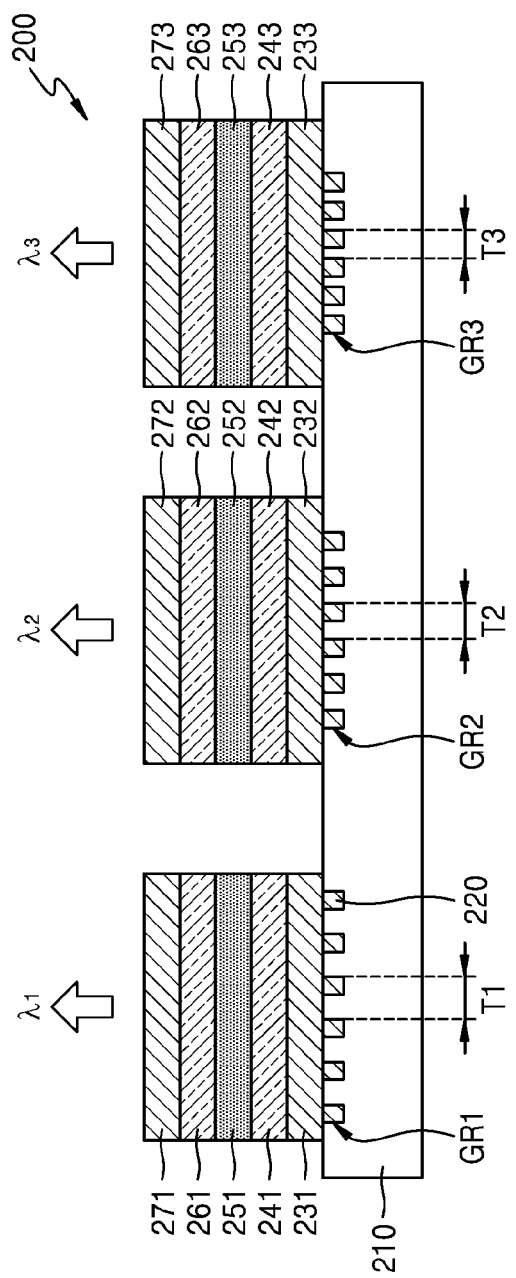
FIG. 6 is a cross-sectional view of a quantum dot light emitting device, according to another exemplary embodiment.

FIG. 6 is a cross-sectional view of a quantum dot light emitting device 200, according to another exemplary embodiment.

The quantum dot light emitting device 200 has a structure that is capable of emitting light of multiple wavelengths from a single substrate.

A grating device 210 includes a first grating region GR1 that has a first grating interval T1, a second grating region GR1 that has a second grating interval T2, and a third grating region GR3 that has a third grating interval T3. The first, second, and third grating intervals T1, T2, and T3 may differ from each other.

A first quantum dot layer 251 is disposed above the first grating region GR1. The first quantum dot layer 251 may include quantum dots designed to emit light of a wavelength band selected by the first grating region GR1. A wavelength band of light emitted from the first quantum dot layer 251 may include the wavelength band selected by the first grating region GR1. The first quantum dot layer 251 and the first grating region GR1 may have equal or similar center wavelengths. For example, the difference between the center wavelengths thereof may be within several ten nanometers.

The first quantum dot layer 251 may emit, for example, light of a red wavelength band. Quantum dots appropriate to emit red light may include, for example, CdSe, CdS, CdTe, InP, GaAs, AlSb, GaSb, InAs, InN, ZnSb, MoS, CuO, or Si.

As elements for injecting electrons and holes into the first quantum dot layer 251, a first electrode 271, an electron transport layer 261, a hole transport layer 241, and a second electrode 231 may be further provided.

A part of the quantum dot light emitting device 200 that corresponds to the first grating region GR1 may emit light of a wavelength band that has a center wavelength of $\lambda_1$ by using the first grating region GR1 and the first quantum dot layer 251. The width of the wavelength band of the emitted light may be less than the width of a wavelength band of light emitted by using only the first quantum dot layer 251.

A second quantum dot layer 252 is disposed above the second grating region GR2. The second quantum dot layer 252 may include quantum dots designed to emit light of a wavelength band selected by the second grating region GR2. A wavelength band of light emitted from the second quantum dot layer 252 may include the wavelength band selected by the second grating region GR2. The second quantum dot layer 252 and the second grating region GR2 may have equal or similar center wavelengths. For example, the difference between the center wavelengths thereof may be within several ten nanometers.

The second quantum dot layer 252 may emit, for example, light of a green wavelength band. Quantum dots appropriate to emit green light may include, for example, CdSe, CdS, CdTe, InP, GaAs, AlSb, GaSb, InAs, InN, ZnSb, MoS, CuO, or Si.

As elements for injecting electrons and holes into the second quantum dot layer 252, a first electrode 272, an electron transport layer 262, a hole transport layer 242, and a second electrode 232 may be further provided.

A part of the quantum dot light emitting device 200 that corresponds to the second grating region GR2 may emit light of a wavelength band having a center wavelength of $\lambda_2$ by using the second grating region GR2 and the second quantum dot layer 252. $\lambda_2$ may be less than $\lambda_1$. In this regard, the grating interval T2 of the second grating region GR2 may be less than the grating interval T1 of the first grating region GR1. The width of the wavelength band of the emitted light may be less than the width of a wavelength band of light emitted by using only the second quantum dot layer 252.

A third quantum dot layer 253 is disposed above the third grating region GR3. The third quantum dot layer 253 may include quantum dots designed to emit light of a wavelength band selected by the third grating region GR3. A wavelength band of light emitted from the third quantum dot layer 253 may include the wavelength band selected by the third grating region GR3. The third quantum dot layer 253 and the third grating region GR3 may have equal or similar center wavelengths. For example, the difference between the center wavelengths thereof may be within several ten nanometers.

The third quantum dot layer 253 may emit, for example, light of a blue wavelength band. Quantum dots appropriate to emit blue light may include, for example, CdSe, CdS, InP, ZnSe, MnSe, GaP, AlAs, ZnTe, MnTe, FeO, or AlP.

As elements for injecting electrons and holes into the third quantum dot layer 253, a first electrode 273, an electron transport layer 263, a hole transport layer 243, and a second electrode 233 may be further provided.

A part of the quantum dot light emitting device 200 that corresponds to the third grating region GR3 may emit light of a wavelength band having a center wavelength of $\lambda_3$ by using the third grating region GR3 and the third quantum dot layer 253. $\lambda_3$ may be less than $\lambda_2$ and $\lambda_1$. In this regard, the grating interval T3 of the third grating region GR3 may be less than the grating interval T1 of the first grating region GR1 and the grating interval T2 of the second grating region GR2. The width of the wavelength band of the emitted light may be less than the width of a wavelength band of light emitted by using only the third quantum dot layer 253.

The first, second, and third quantum dot layers 251, 252, and 253 may be configured to include quantum dots made of the same material but having different sizes. In this case, the larger the size of the quantum dots becomes, the longer the wavelength band of the light to be emitted may become. In this aspect, when $\lambda_1 > \lambda_2 > \lambda_3$, the quantum dots included in the first quantum dot layer 251 may be the largest, the quantum dots included in the second quantum dot layer 252 may be the second largest, and the quantum dots included in the third quantum dot layer 253 may be the smallest.

Although FIG. 6 illustrates that the first, second, and third grating regions GR1, GR2, and GR3 emit light of three different wavelength bands having center wavelengths of $\lambda_1$, $\lambda_2$, and $\lambda_3$, the quantum dot light emitting device 200 is not limited thereto. The quantum dot light emitting device 200 may include grating regions for emitting light of four or more different center wavelength bands. For example, the quantum dot light emitting device 200 may include grating regions for emitting light of seven different colors. The above principle is equally applied to the following exemplary embodiments.

Figure 7:
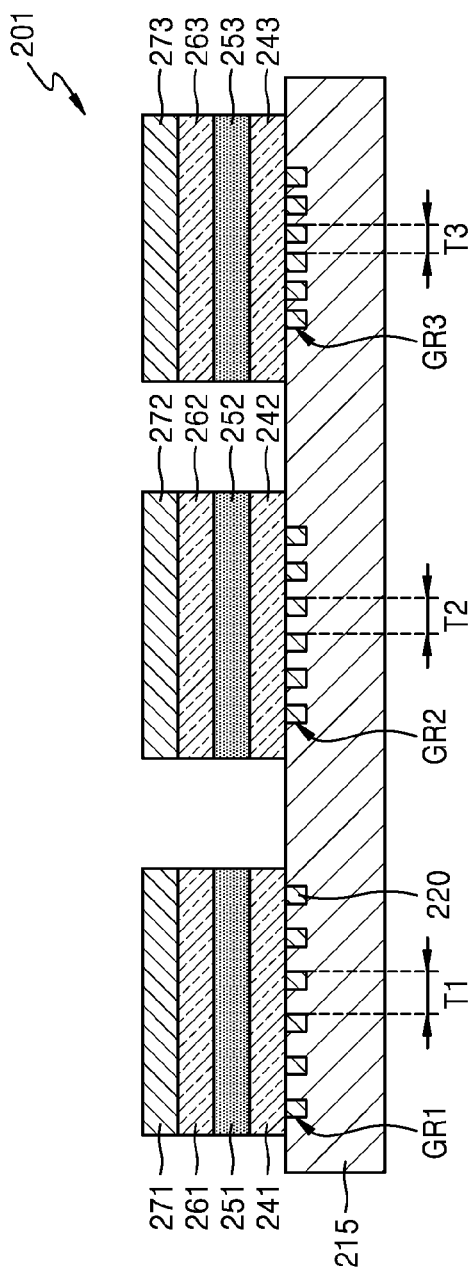
FIG. 7 is a cross-sectional view of a quantum dot light emitting device, according to another exemplary embodiment.

FIG. 7 is a cross-sectional view of a quantum dot light emitting device 201, according to another exemplary embodiment.

The quantum dot light emitting device 201 of the current exemplary embodiment differs from the quantum dot light emitting device 200 of FIG. 6 in that a grating device 215 is made of a conductive material. Since the grating device 215 is made of the conductive material, among elements for injecting electrons and holes into first, second, and third quantum dot layers 251, 252, and 253, the second electrodes 231, 232, and 233 included in the quantum dot light emitting device 200 of FIG. 6 may be omitted. In this aspect, voltages may be applied between the grating device 215 and each of first electrodes 271, 272, and 273, respectively, and emission of light from the first, second, and third quantum dot layers 251, 252, and 253 may be controlled.

Figure 8:
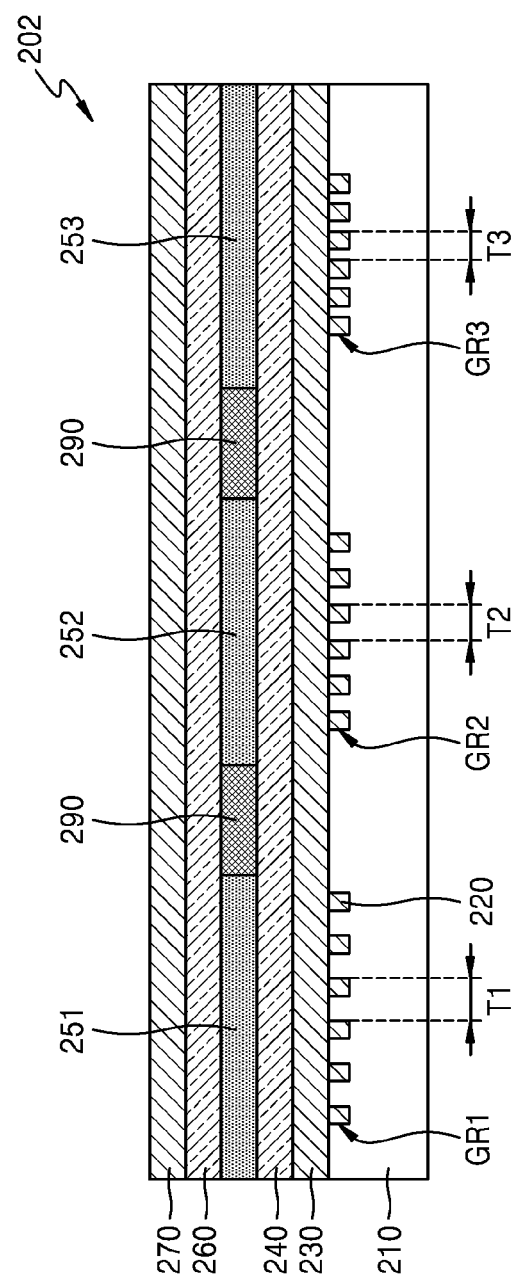
FIG. 8 is a cross-sectional view of a quantum dot light emitting device, according to another exemplary embodiment.

FIG. 8 is a cross-sectional view of a quantum dot light emitting device 202, according to another exemplary embodiment.

In the quantum dot light emitting device 202, a first quantum dot layer 251, a second quantum dot layer 252, and a third quantum dot layer 253 are isolated from each other by barriers 290, and a first electrode 270, an electron transport layer 260, a hole transport layer 240, and a second electrode 230 are shared by the first, second, and third quantum dot layers 251, 252, and 253. Accordingly, the intensities of light emitted from the first, second, and third quantum dot layers 251, 252, and 253 is simultaneously controlled by applying a voltage between the first and second electrodes 270 and 230.

The quantum dot light emitting device 202 of the current exemplary embodiment may be used in a case when the intensities of light of different wavelengths emitted from locations that respectively face grating regions GR1, GR2, and GR3 do not need to be individually controlled.

According to a modification of the current exemplary embodiment, the first electrode 270 may be divided into a plurality of parts which are electrically isolated from each other and arranged so as to individually face the first, second, and third quantum dot layers 251, 252, and 253. In this case, similarly as with respect to the quantum dot light emitting device 200 of FIG. 6 or the quantum dot light emitting device 201 of FIG. 7, the intensities of light of different wavelength bands may be individually controlled.

Figure 9:
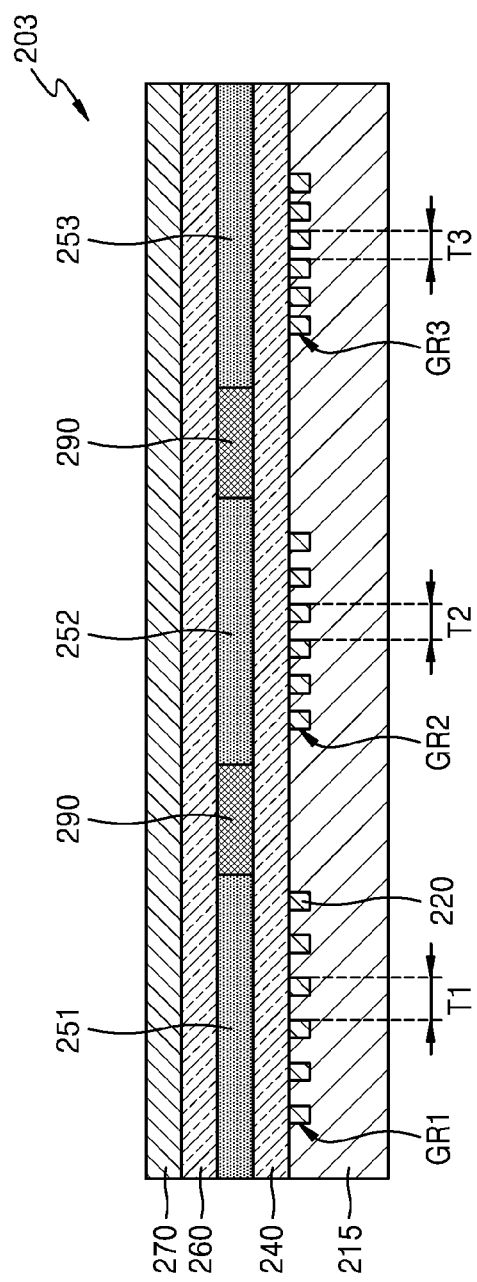
FIG. 9 is a cross-sectional view of a quantum dot light emitting device, according to another exemplary embodiment.

FIG. 9 is a cross-sectional view of a quantum dot light emitting device 203, according to another exemplary embodiment.

The quantum dot light emitting device 203 differs from the quantum dot light emitting device 202 of FIG. 8 in that a grating device 215 is made of a conductive material. Since the grating device 215 is made of the conductive material, the second electrode 230 included in the quantum dot light emitting device 202 of FIG. 8 may be omitted, and a voltage for controlling first, second, and third quantum dot layers 251, 252, and 253 may be applied between the grating device 215 and a first electrode 270.

Figure 10:
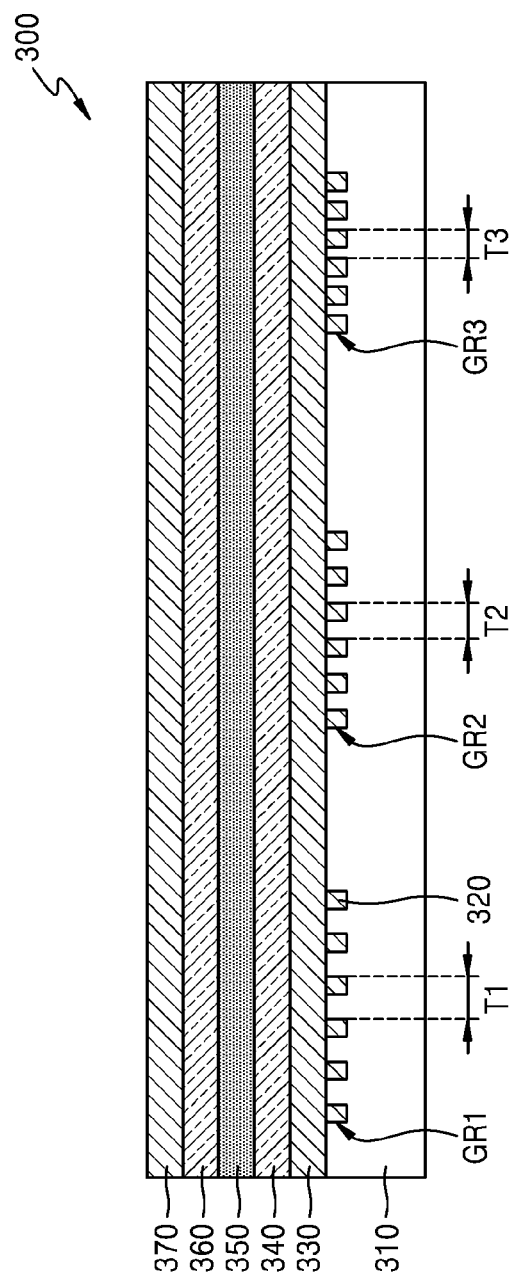
FIG. 10 is a cross-sectional view of a quantum dot light emitting device, according to another exemplary embodiment.

FIG. 10 is a cross-sectional view of a quantum dot light emitting device 300, according to another exemplary embodiment.

The quantum dot light emitting device 300 includes a grating device 310 that includes first, second, and third grating regions GR1, GR2, and GR3 which respectively have different grating intervals T1, T2, and T3, and a quantum dot layer 350 disposed above the grating device 310 so as to entirely cover the first, second, and third grating regions GR1, GR2, and GR3.

The quantum dot layer 350 may be configured to emit light of a plurality of wavelength bands that includes a first wavelength band selected by the first grating region GR1, a second wavelength band selected by the second grating region GR2, and a third wavelength band selected by the third grating region GR3.

The quantum dot layer 350 includes a plurality of quantum dots. As described above, since even quantum dots made of the same material emit light of different wavelength bands that vary based on the sizes of the quantum dots, the quantum dot layer 350 may include, for example, a plurality of quantum dots having at least three different sizes.

Figure 11:
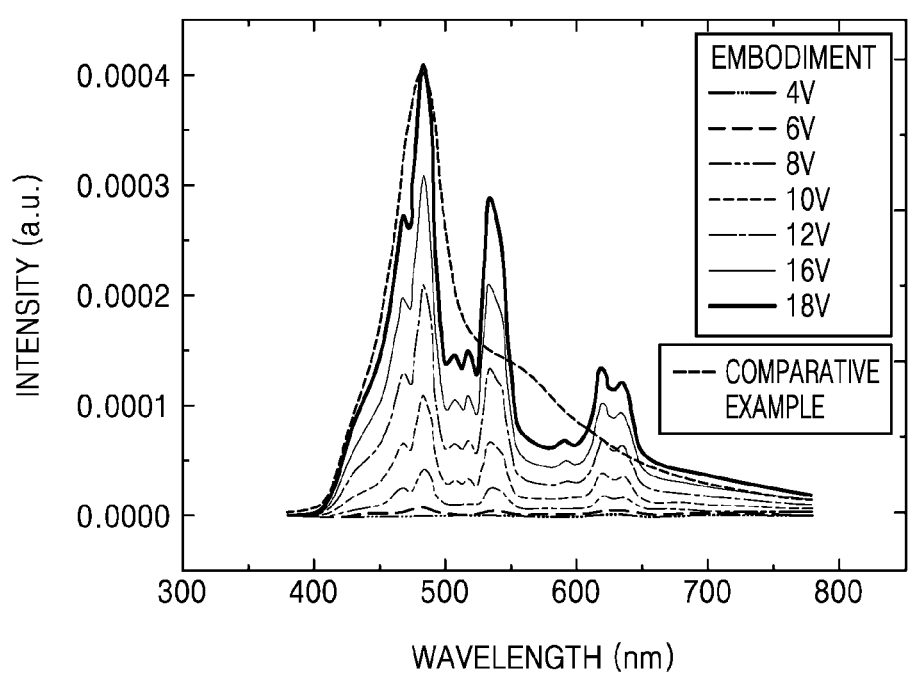
FIG. 11 is a graph showing an emission spectrum of the quantum dot light emitting device of FIG. 10 based on an applied voltage, and an emission spectrum of a quantum dot light emitting device according to a comparative example.

FIG. 11 is a graph showing an emission spectrum of the quantum dot light emitting device 300 of FIG. 10 based on an applied voltage, and an emission spectrum of a quantum dot light emitting device according to a comparative example.

In the graph, the comparative example shows an emission spectrum obtained by using only the quantum dot layer 350 without using any grating device. The emission spectrum of the comparative example is obtained by pumping light without applying a voltage, and thus only the width thereof is compared to that of the exemplary embodiment.

The quantum dot light emitting device 300 according to an exemplary embodiment has an emission spectrum that is modified from the emission spectrum of the comparative example in such a manner that specific wavelength bands are selected by the first, second, and third grating regions GR1, GR2, and GR3. In this aspect, peak values of the emission spectrum are shown at center wavelengths of the first, second, and third grating regions GR1, GR2, and GR3. According to the graph, even when the same-type quantum dot layer 350 is disposed above the first, second, and third grating regions GR1, GR2, and GR3 irrespective of the first, second, and third grating regions GR1, GR2, and GR3, light of different wavelength bands distinguished by the grating intervals T1, T2, and T3 may be emitted.

Figure 12:
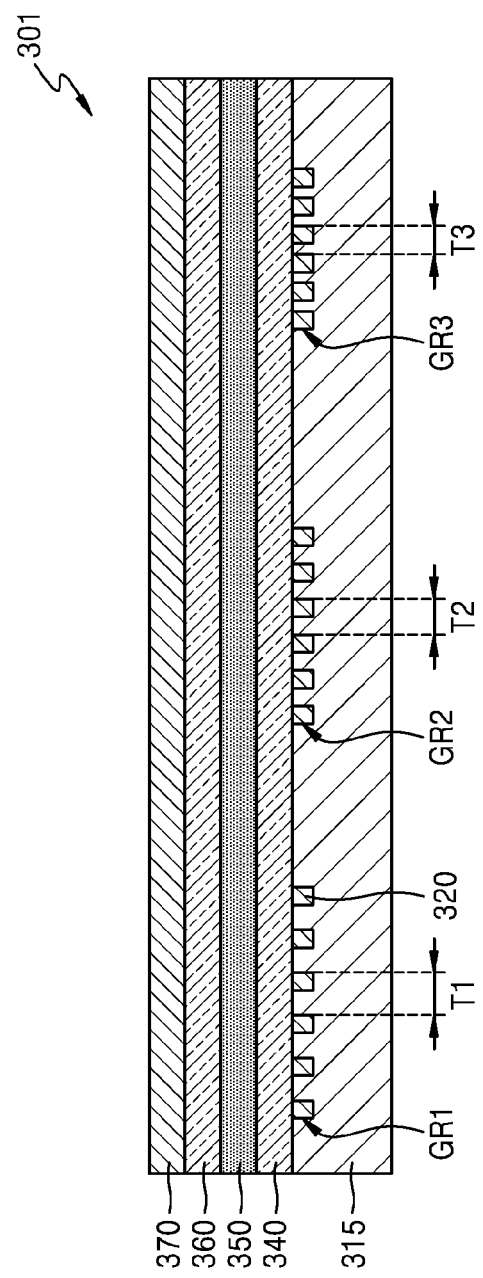
FIG. 12 is a cross-sectional view of a quantum dot light emitting device, according to another exemplary embodiment.

FIG. 12 is a cross-sectional view of a quantum dot light emitting device 301, according to another exemplary embodiment.

The quantum dot light emitting device 301 differs from the quantum dot light emitting device 300 of FIG. 10 in that a grating device 315 is made of a conductive material and that a second electrode 330 included in the quantum dot light emitting device 300 of FIG. 10 is omitted. A voltage for controlling a quantum dot layer 350 may be applied between the grating device 315 and a first electrode 370.

Figure 13:
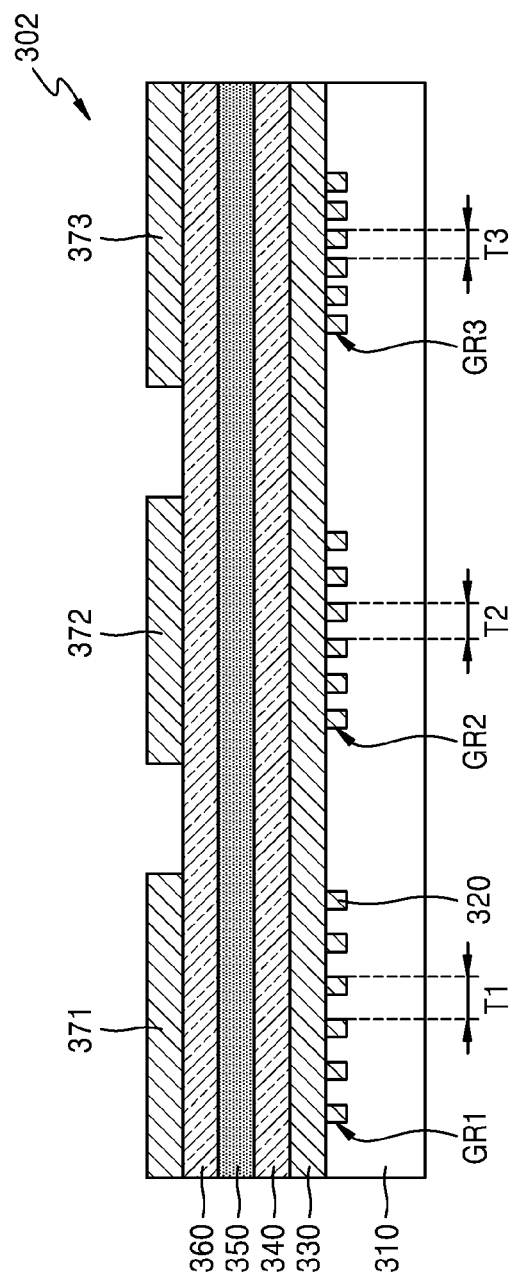
FIG. 13 is a cross-sectional view of a quantum dot light emitting device, according to another exemplary embodiment.

FIG. 13 is a cross-sectional view of a quantum dot light emitting device 302, according to another exemplary embodiment.

Unlike the quantum dot light emitting device 300 of FIG. 10, the quantum dot light emitting device 302 has a structure that is capable of individually controlling the intensities of light of different wavelength bands emitted from different parts. A plurality of first electrodes 371, 372, and 373 which are electrically isolated from each other are provided on a quantum dot layer 350. The first electrode 371 is arranged so as to face a first grating region GR1, the first electrode 372 is arranged so as to face a second grating region GR2, and the first electrode 373 is arranged so as to face a third grating region GR3.

Respective voltages may be individually applied between each of the first electrodes 371, 372, and 373 and a second electrode 330. As such, injection of electrons and holes into a corresponding part of the quantum dot layer 350, i.e., a part that is disposed between the corresponding one of the first electrodes 371, 372, and 373 and the second electrode 330, may be controlled, and thus the intensities of light of different wavelength bands emitted from different parts may be controlled.

Figure 14:
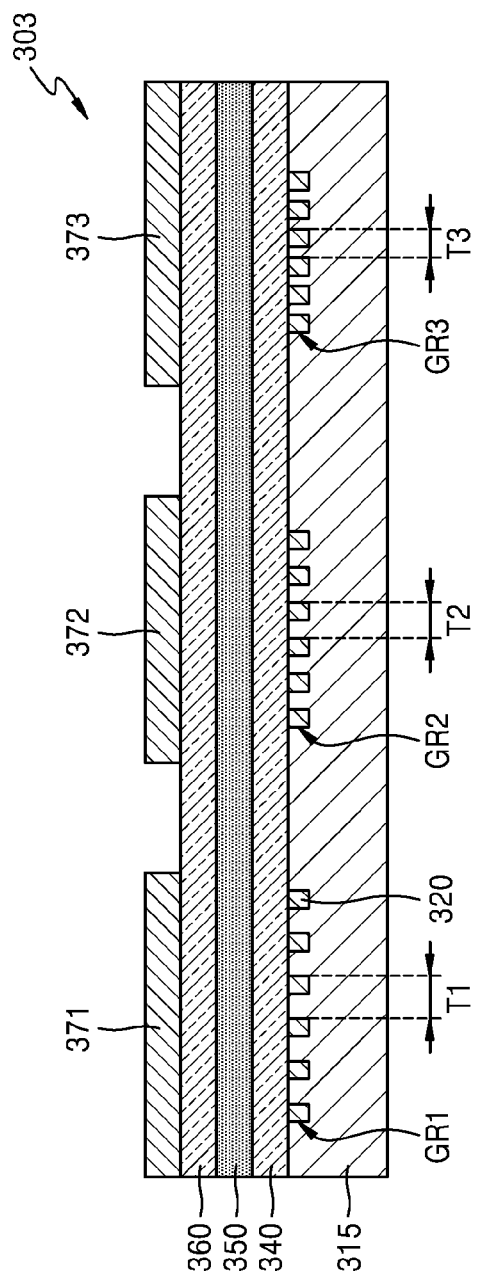
FIG. 14 is a cross-sectional view of a quantum dot light emitting device, according to another exemplary embodiment.

FIG. 14 is a cross-sectional view of a quantum dot light emitting device 303, according to another exemplary embodiment.

The quantum dot light emitting device 303 differs from the quantum dot light emitting device 302 of FIG. 13 in that a grating device 315 is made of a conductive material and that the second electrode 330 included in the quantum dot light emitting device 302 of FIG. 13 is omitted. Respective voltages may be individually applied between the grating device 315 and each of a plurality of first electrodes 371, 372, and 373 to control parts of a quantum dot layer 350 that respectively face the first, second, and third grating regions GR1, GR2, and GR3.

Figure 15:
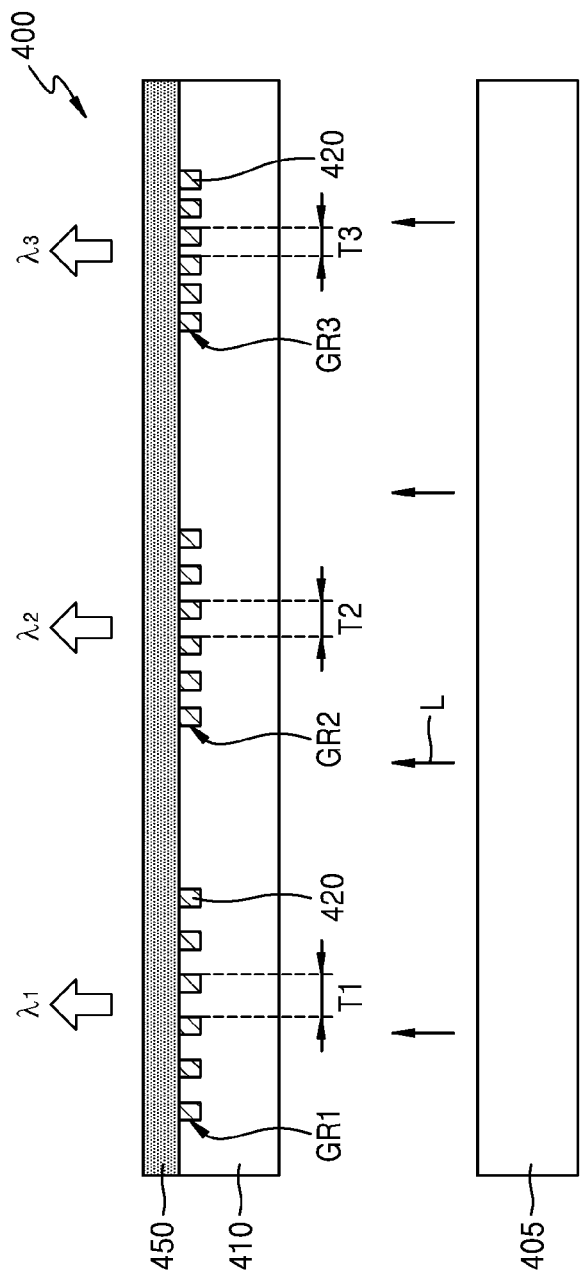
FIG. 15 is a cross-sectional view of a quantum dot light emitting device, according to another exemplary embodiment.

FIG. 15 is a cross-sectional view of a quantum dot light emitting device 400, according to another exemplary embodiment.

The quantum dot light emitting device 400 includes a grating device 410 including first, second, and third grating regions GR1, GR2, and GR3 that respectively have different grating intervals T1, T2, and T3, and a quantum dot layer 450 disposed on the grating device 410. A filling material 420 made of a material that has a refractive index which is different from a refractive index of the grating device 410 may be provided in spaces between protruding patterns of each of the first, second, and third grating regions GR1, GR2, and GR3. The quantum dot light emitting device 400 further includes a pump light source 405 for providing exciting light L to the quantum dot layer 450.

The quantum dot light emitting device 400 according to the current exemplary embodiment has a structure which is configured for emitting light from the quantum dot layer 450 by using light provided from the pump light source 405, and does not include elements for applying a voltage to the quantum dot layer 450, e.g., electrodes, an electron transport layer, and a hole transport layer.

Like the above-described quantum dot layer 350 of FIG. 10, the quantum dot layer 450 may be configured to emit light of a plurality of wavelength bands including a first wavelength band selected by the first grating region GR1, a second wavelength band selected by the second grating region GR2, and a third wavelength band selected by the third grating region GR3. The quantum dot layer 450 may include, for example, a plurality of quantum dots having at least three different sizes.

The pump light source 405 may provide the exciting light L that has a shorter wavelength band than the wavelength band of the quantum dot layer 450, to the quantum dot layer 450. The quantum dot layer 450 absorbs the light L provided from the pump light source 405 and emits light of a longer wavelength band than the wavelength band of the light L. Since the first, second, and third grating regions GR1, GR2, and GR3 select light of different wavelength bands from the light emitted from the quantum dot layer 450, parts of the quantum dot layer 450 selectively emit light of wavelength bands that have a plurality of different center wavelengths $\lambda_1$, $\lambda_2$, and $\lambda_3$.

Although FIG. 15 illustrates that the quantum dot layer 450 entirely covers the first, second, and third grating regions GR1, GR2, and GR3, the quantum dot layer 450 is not limited thereto. In particular, different quantum dot layers for emitting light of wavelength bands that have the respective center wavelengths $\lambda_1$, $\lambda_2$, and $\lambda_3$ may be individually provided on the first, second, and third grating regions GR1, GR2, and GR3.

In addition, the pump light source 405 may be modified to include a plurality of light sources in order to control the intensities of light irradiated onto the first, second, and third grating regions GR1, GR2, and GR3, or a shutter structure for controlling the intensity of light irradiated onto each of the first, second, and third grating regions GR1, GR2, and GR3 may be further provided.

Hereinabove, various examples of a quantum dot light emitting device that includes a quantum dot layer and a grating device together to emit high-purity color light having a small-width spectrum, and examples of emitting light of multiple wavelengths from a single substrate have been described. Although light of three wavelength bands has been described as an example of the light of multiple wavelengths, the number of wavelength bands is not limited thereto, provided that light of two or more wavelength bands is emitted.

The above-described quantum dot light emitting device may be applied to a variety of optical apparatuses, and descriptions are now given of examples thereof.

Figure 16:
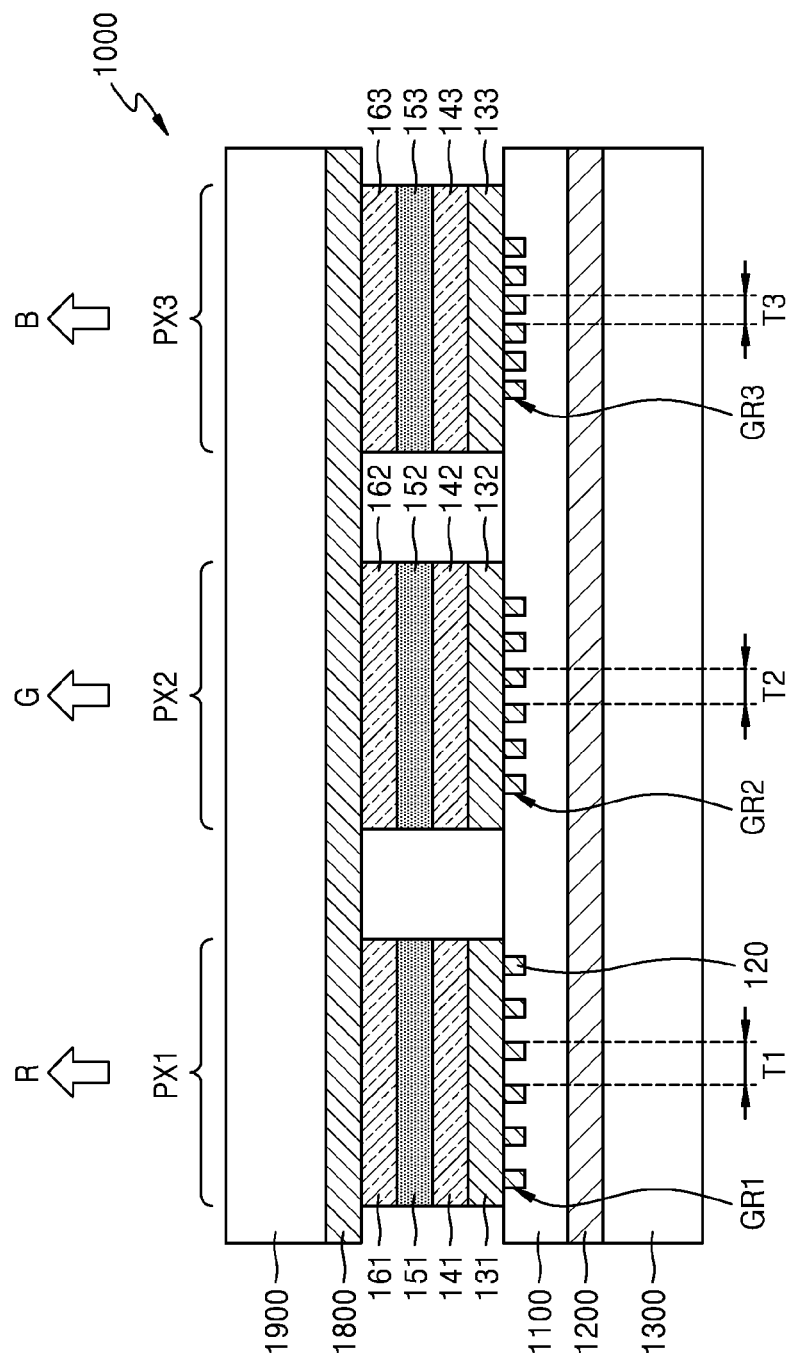
FIG. 16 is a cross-sectional view of a display apparatus. according to an exemplary embodiment.

FIG. 16 is a cross-sectional view of a display apparatus 1000, according to an exemplary embodiment.

The display apparatus 1000 includes a grating device 1100 including a first grating region GR1 that has a first grating interval T1, a second grating region GR2 that has a second grating interval T2 which is different from the first grating interval T1 of the first grating region GR1, and a third grating region GR3 that has a third grating interval T3 which is different from the first and second grating intervals T1 and T2 of the first and second grating regions GR1 and GR2. The display apparatus 1000 further includes a first quantum dot layer 151 that is arranged to face the first grating region GR1, a second quantum dot layer 152 that is arranged to face the second grating region GR2, and a third quantum dot layer 153 that is arranged to face the third grating region GR3.

The first grating region GR1 and the first quantum dot layer 151 may configure a first pixel PX1, and the grating interval T1 and the material and size of quantum dots included in the first quantum dot layer 151 may be set to emit light of a red wavelength band. The second grating region GR2 and the second quantum dot layer 152 may configure a second pixel PX2, and the grating interval T2 and the material and size of quantum dots included in the second quantum dot layer 152 may be set to emit light of a green wavelength band. The third grating region GR3 and the third quantum dot layer 153 may configure a third pixel PX3, and the grating interval T3 and the material and size of quantum dots included in the third quantum dot layer 153 may be set to emit light of a blue wavelength band.

As illustrated in FIG. 16, the first pixel PX1 may be defined by a structure that includes a second electrode 131, a hole transport layer 141, the first quantum dot layer 151, and an electron transport layer 161. The second pixel PX2 may be defined by a structure that includes a second electrode 132, a hole transport layer 142, the second quantum dot layer 152, and an electron transport layer 162. The third pixel PX3 may be defined by a structure that includes a second electrode 133, a hole transport layer 143, the third quantum dot layer 153, and an electron transport layer 163.

A first electrode 1800 may be arranged so as to face all of the first, second, and third quantum dot layers 151, 152, and 153. The first electrode 1800 may be disposed under a first substrate 1900.

The display apparatus 1000 may further include a driving circuit layer 1200 which includes a plurality of transistors (not shown) for individually providing independent electrical signals to the second electrodes 131, 132, and 133 in order to control an emission of light from each of the first, second, and third quantum dot layers 151, 152, and 153. A data electrode of each of the transistors included in the driving circuit layer 1200 may be, for example, electrically connected to each of the second electrodes 131, 132, and 133 via a conductive through hole which penetrates the grating device 1100. The above-described driving circuit layer 1200 may be disposed on a second substrate 1300.

Since the driving circuit layer 1200 transmits control signals based on image data individually to each of the second electrodes 131, 132, and 133, the first, second, and third quantum dot layers 151, 152, and 153 may be controlled and intensity-controlled light may be emitted from the first, second, and third pixels PX1, PX2, and PX3 in order to display an image.

Figure 17:
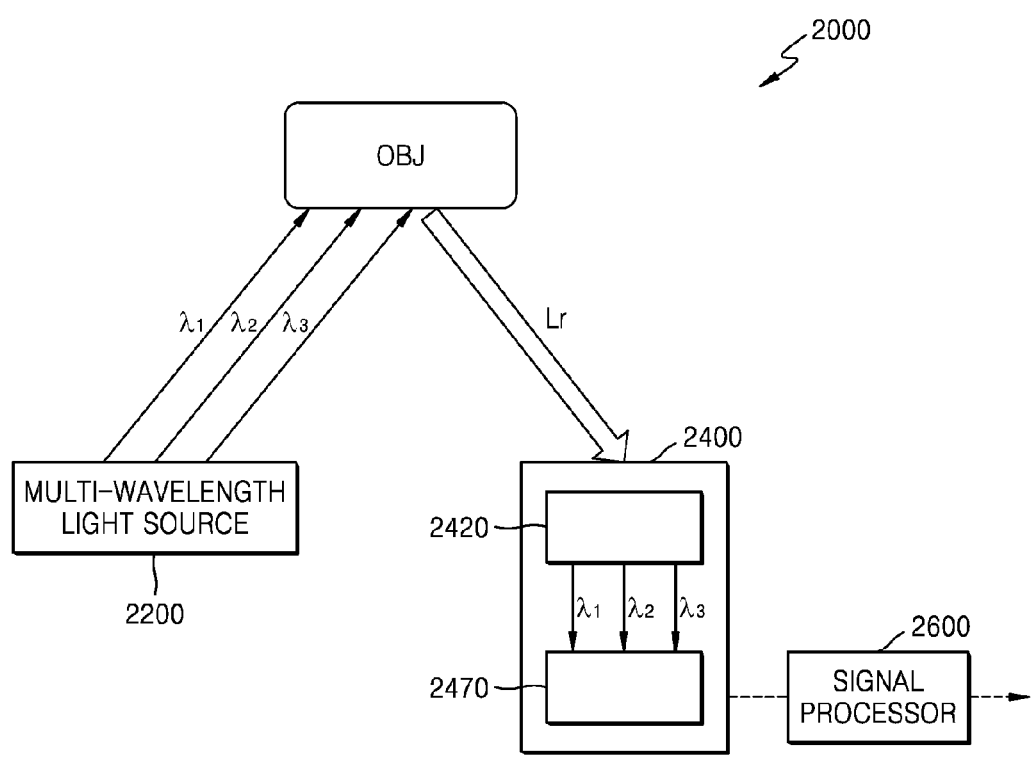
FIG. 17 is a block diagram of an optical sensor, according to an exemplary embodiment.

FIG. 17 is a block diagram of an optical sensor 2000, according to an exemplary embodiment.

The optical sensor 2000 includes a multi-wavelength light source 2200 which is configured for irradiating light onto an object OBJ, and a light receiver 2400 which is configured for receiving light reflected from the object OBJ. The optical sensor 2000 may further include a signal processor 2600 which is configured for analyzing information about the object OBJ from an optical signal detected by the light receiver 2400.

The multi-wavelength light source 2200 may be configured to irradiate light of multiple wavelength bands onto the object OBJ, and modified from one or more of the above-described quantum dot light emitting devices. Although FIG. 17 illustrates light of three wavelength bands having respective center wavelengths of $\lambda_1$, $\lambda_2$, and $\lambda_3$, the number of wavelength bands is not limited thereto, provided that light of two or more wavelength bands is irradiated.

A variety of optical members may be further provided between the multi-wavelength light source 2200 and the object OBJ. For example, a path changing member which is configured for allowing light to proceed toward the object OBJ or a beam steering member which is configured for scanning the object OBJ may be further provided.

The light receiver 2400 may be configured to obtain information about the multiple wavelength bands by using the light reflected from the object OBJ, and analyze information about the object OBJ.

The light receiver 2400 may include a sensor unit (also referred to herein as a "sensor component") 2470 and optionally include a demultiplexer 2420.

The demultiplexer 2420 may demultiplex light $L_r$ reflected from the object OBJ in order to split the light into multiple beams having different wavelengths $\lambda_1$, $\lambda_2$, and $\lambda_3$. Herein, the wavelengths $\lambda_1$, $\lambda_2$, and $\lambda_3$ may be equal or similar to the wavelengths $\lambda_1$, $\lambda_2$, and $\lambda_3$ of the light emitted from the multi-wavelength light source 2200, respectively.

The sensor unit 2470 may include a plurality of photodetection elements that are capable of sensing light of different wavelengths. Information sensed by using the photodetection elements may be used to analyze information about the object OBJ. As the photodetection elements, for example, photodiodes, phototransistors, or charge-coupled devices (CCDs) may be used.

The signal processor 2600 may analyze information about the object OBJ by performing any of various calculation operations and transmit the same to another unit. The information about the object OBJ may include, for example, physical properties of the object OBJ or information about the location, shape, and motion of the object OBJ. The signal processor 2600 may include a memory for storing data and programs required for calculation.

Since multiple beams having different wavelengths are used, the optical sensor 2000 using the multi-wavelength light source 2200 may increase the speed of scanning the object OBJ and may be used to obtain various types of information, including the physical properties as well as the location and shape of the object OBJ, by analyzing the multiple beams having different wavelengths.

The above-described quantum dot light emitting device may generate high-purity color light by employing a grating device that has a grating interval which corresponds to a wavelength band of light emitted from a quantum dot layer.

The above-described quantum dot light emitting device may include grating regions that have respective grating intervals which individually correspond to various types of quantum dot layers, and thus may be used as a multi-wavelength light source that is capable of emitting light of multiple wavelengths from a single substrate.

The above-described quantum dot light emitting device may be applied to a variety of types of optical apparatuses, such as, for example, display apparatuses and sensors.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A quantum dot light emitting device comprising:
   a grating device comprising a first grating region that has a first grating interval, a second grating region that has a second grating interval, and a third grating region that has a third grating interval, the first grating interval, the second grating interval, and the third grating interval being different from each other;
   an emission layer located above the grating device and comprising a first quantum dot layer configured to emit light of a wavelength band which is selected by the first grating region; and
   a first electrode and a second electrode,
   wherein the grating device is made of a dielectric material and disposed below the plurality of second electrodes, and
   wherein the first electrode, the first quantum dot layer, the second electrode, and the grating device are successively stacked.

2. The quantum dot light emitting device of claim 1, wherein the first electrode, the first quantum dot layer, the second electrode, and the grating device are successively stacked in a direction that is perpendicular to a direction of the first grating interval.

3. The quantum dot light emitting device of claim 1, further comprising:
   a hole transport layer located between the first quantum dot layer and the first electrode; and
   an electron transport layer located between the first quantum dot layer and the second electrode.

4. The quantum dot light emitting device of claim 1, wherein the first grating region comprises a plurality of pillar-shaped protruding patterns or groove patterns.

5. The quantum dot light emitting device of claim 1, further comprising a pump light source configured to provide exciting light to the emission layer.

6. The quantum dot light emitting device of claim 1, wherein the first quantum dot layer is configured to emit light of a plurality of wavelength bands including a first wavelength band selected by the first grating region, a second wavelength band selected by the second grating region, and a third wavelength band selected by the third grating region.

7. The quantum dot light emitting device of claim 1, wherein the first quantum dot layer comprises a plurality of quantum dots that has at least three different quantum dot sizes.

8. The quantum dot light emitting device of claim 1, wherein the grating device is made of a dielectric material.

9. The quantum dot light emitting device of claim 1, wherein the first grating region comprises a plurality of strip-shaped protruding patterns.

10. The quantum dot light emitting device of claim 9, wherein spaces between the protruding patterns are filled with a material that has a refractive index which is different from a refractive index of the grating device.

11. The quantum dot light emitting device of claim 1, wherein the grating device is made of a conductive material.

12. The quantum dot light emitting device of claim 11, wherein when a voltage is applied between the first electrode and the grating device, the applied voltage causes an emission of light from the emission layer.

13. An optical sensor comprising:
    the quantum dot light emitting device of claim 1 which is configured to irradiate light toward an object; and
    a sensor component configured to receive light reflected from the object.

14. The optical sensor of claim 13, wherein the first quantum dot layer is arranged to face both of the first grating region and the second grating region.

15. The optical sensor of claim 14, wherein the first quantum dot layer is configured to emit light of a plurality of wavelength bands which includes a first wavelength band selected by the first grating region, and a second wavelength band selected by the second grating region.

16. A display apparatus comprising:
    a grating device comprising a first grating region that has a first grating interval, a second grating region that has a second grating interval which is different from the first grating interval, and a third grating region that has a third grating interval which is different from each of the first grating interval and the second grating interval;
    an emission layer located above the grating device and comprising a first quantum dot layer that is arranged to face the first grating region, a second quantum dot layer that is arranged to face the second grating region, and a third quantum dot layer that is arranged to face the third grating region;
    a first electrode that is arranged to face the emission layer; and
    a plurality of second electrodes, each respective second electrode being arranged to face a corresponding one from among the first quantum dot layer, the second quantum dot layer, and the third quantum dot layer,
    wherein the grating device is made of a dielectric material and disposed below the plurality of second electrodes, and
    wherein the first electrode, the emission layer, the plurality of second electrodes, and the grating device are successively stacked.

17. The display apparatus of claim 16, further comprising a driving circuit layer comprising a plurality of transistors, each respective transistor being configured to provide a respective electrical signal to a corresponding one from among the plurality of second electrodes in order to control an emission of light from the first quantum dot layer, the second quantum dot layer, and the third quantum dot layer.

18. A quantum dot light emitting device comprising:
    a grating device comprising a first grating region that has a first grating interval, and at least a second grating region that has a second grating interval which is different from the first grating interval; and
    a first electrode disposed above the grating device;
    a quantum dot layer disposed above the first electrode and configured to emit light of a plurality of wavelengths; and
    a second electrode disposed above the quantum dot layer,
    wherein the quantum dot layer is arranged to face all of the first grating region and the second grating region, and
    wherein the plurality of wavelengths includes a first wavelength that corresponds to the first grating region and a second wavelength that corresponds to the second grating region.

19. The quantum dot light emitting device of claim 18, wherein the quantum dot layer is stacked on top of the first electrode and the second electrode is stacked on top of the quantum dot layer.

20. The quantum dot light emitting device of claim 18, further comprising a hole transport layer disposed between the first electrode and the quantum dot layer and an electron transport layer disposed between the quantum dot layer, such that the first electrode, the hole transport layer, the quantum dot layer, the electron transport layer, and the second electrode are successively stacked.

21. The quantum dot light emitting device of claim 18, wherein the grating device further comprises at least a third grating region that has a third grating interval which is different from each of the first grating interval and the second grating interval, wherein the plurality of wavelengths further includes a third wavelength that corresponds to the third grating region.

* * * * *